United States Patent [19]

Takamisawa et al.

[11] 4,357,574

[45] Nov. 2, 1982

[54] LOADING APPARATUS FOR TESTING A POWER SUPPLY

[75] Inventors: Kaihei Takamisawa; Masatoshi Yui, both of Tokyo, Japan

[73] Assignee: Takamisawa Cybernetics Co., Ltd., Tokyo, Japan

[21] Appl. No.: 143,706

[22] Filed: Apr. 25, 1980

[30] Foreign Application Priority Data

May 21, 1979 [JP] Japan .............................. 54-66822[U]
May 21, 1979 [JP] Japan .............................. 54-66824[U]
Sep. 11, 1979 [JP] Japan ............................ 54-124710[U]

[51] Int. Cl.³ ....................... G01R 15/12; G01R 31/36
[52] U.S. Cl. .................................... 324/73 R; 324/426
[58] Field of Search .............................. 324/426–430, 324/73 R, 73 AT, 158 R; 320/48

[56] References Cited

U.S. PATENT DOCUMENTS

| | | | |
|---|---|---|---|
| 3,500,167 | 3/1970 | Applegate et al. | 324/426 X |
| 3,593,099 | 7/1971 | Scholl | 324/429 X |
| 3,594,642 | 7/1971 | Wright | 324/426 X |
| 3,848,181 | 11/1974 | Hebert et al. | 324/429 |
| 3,969,667 | 7/1976 | McWilliams | 324/427 |
| 4,021,718 | 5/1977 | Konrad | 324/465 X |
| 4,163,194 | 7/1979 | Ross | 324/73 R X |

Primary Examiner—Gerard R. Strecker
Attorney, Agent, or Firm—Jordan and Hamburg

[57] ABSTRACT

Loading apparatus for testing a power supply comprises an electronic load circuit, the electronic load circuit comprising an organically and systematically connected mode switching circuit capable switching from and to one another a constant resistance mode, a constant current mode and a slave mode. A load switching circuit is connected to the mode switching circuit and an error amplifier is adapted to input a voltage signal in each of the modes. A field effect transistor circuit is adapted to receive the output of the error amplifier as a gate control signal and has a drain terminal to which is fed the output from a power unit under test and further has a source terminal, the output of which is fed back as a comparison voltage signal to the error amplifier. A current measurement display circuit is branched to the source terminal of the field effect transistor circuit, and an overpower protection warning circuit is also branched to the source terminal. A voltage measurement display circuit is connected to the drain terminal, and a switching time setting circuit is provided for setting an automatic switching time in the load switching circuit.

13 Claims, 12 Drawing Figures

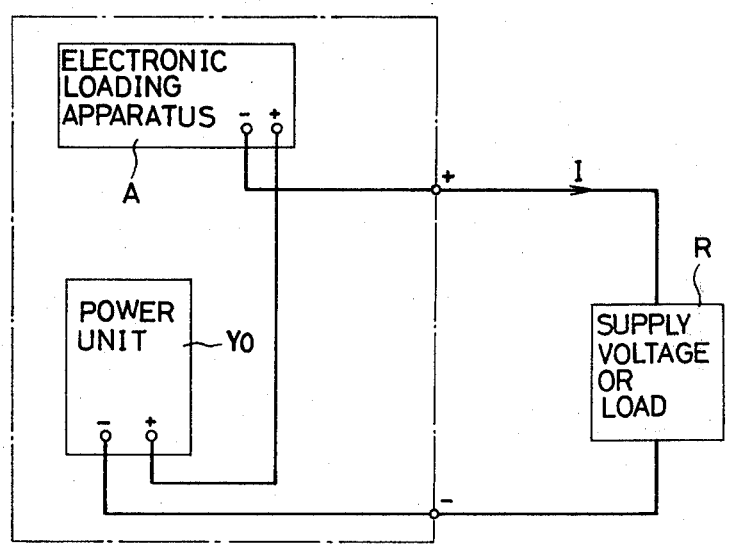
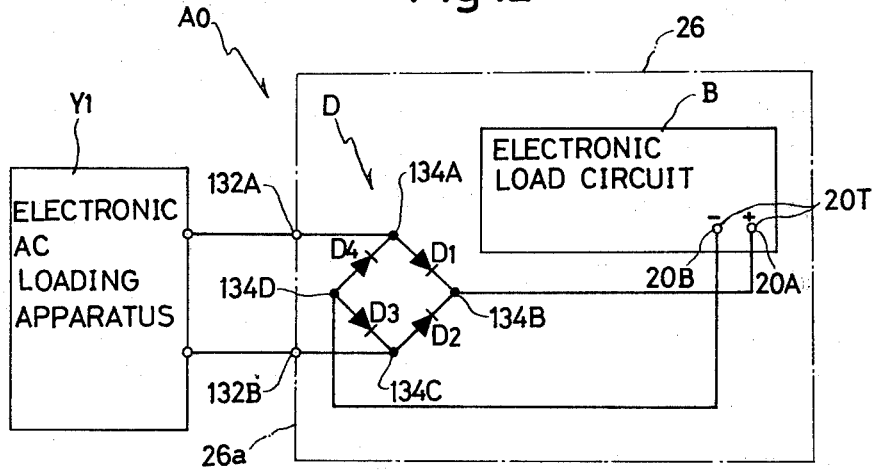

LOADING APPARATUS FOR TESTING A POWER SUPPLY

This invention relates to a loading apparatus or artificial dummy load useful in testing a power supply.

Although it is desirable that a load test of a direct current (alternating to direct current) power supply be carried out with conditions close to the real conditions of use, perhaps it is impossible for all of a very heavy load condition to occur in a short time period of the real test. Therefore, in the power supply load test, a new load apparatus, which can synthesize all of such heavy or severe load conditions artificially, is required. As such load apparatus there have heretofore been used a wire wound resistor or carbon pile resistor or slide rheostat resistor, but these load resistors are only used in static load characteristics tests of a power supply, and can not be used for dynamic load characteristics tests, such as response speed of power supply due to a change in load, and they have been unsuitable as dummy loads for load testing a regulated power supply for most electronic apparatus (for example, for a computer).

Conventionally, when using a slide rheostat as a dummy load in the load test of a power source, it has been necessary to provide several slide rheostats due to alteration of resistance value and load power; besides, a switching test requires more complicated operations.

In the case of using the foregoing winding resistance or a carbon pile as a loading device, capacity is decided by setting a movable needle to the scale provided on the outer wall of the loading device, so the relation between the needle and the scale must be exact. For example, however, if the needle and the scale are not in exact relation due to a secular change of the contact surface between contact and resistance of the load device, it becomes no longer possible to make an exact test of a power supply. Especially in the case of a power supply for electronic devices with which excellent characteristics are required as in recent years, it is essential that tests be conducted under exact conditions.

It is a first object of this invention to provide a versatile artificial or dummy load apparatus for testing a power supply, which is useful as a tool to test static and dynamic characteristics (for example, percentage regulation) of a power supply in loading.

It is a second object of this invention to provide an artificial load apparatus for testing a power supply whereby the actual loading characteristics can be determined.

It is a third object of this invention to provide an artificial load apparatus for testing a power supply where the load value of the power supply can be indicated by a digital indicator.

It is a fourth object of this invention to provide a load apparatus for testing a power supply for direct current delivery.

It is a fifth object of this invention to provide an artificial loading apparatus for testing a power supply whereby any of the following three modes, i.e., constant resistance (priority nomination) mode, constant current (priority nomination) mode and slave (machine connection) mode, can be selected arbitrarily.

It is a sixth object of this invention to provide a loading apparatus for testing a power supply having a constant resistance mode in which any value of resistance can be varied continuously.

It is a seventh object of this invention to provide a loading apparatus for testing a power supply having a constant current mode with automatically changing internal resistance of an electronic load circuit in which load current values can be set in a continuous manner and, once set, there flows current at the set value even if the voltage changes.

It is an eighth object of this invention to provide a loading apparatus for testing a power supply having a slave mode in which, in the case of a parallel operation of two or more units connected together, a reference voltage from the exterior is connected and a current according to the reference voltage is allowed to flow.

It is a ninth object of this invention to provide a loading apparatus for testing a power supply which loading apparatus is provided with a safety protection warning circuit.

Other objects of this invention will become apparent from concrete and detailed description of the specification and the accompanying drawings.

Figure 6:
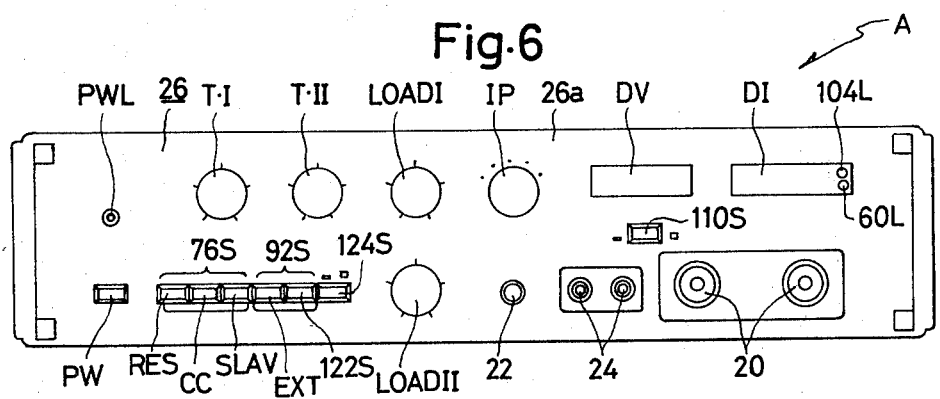
Figure 7:
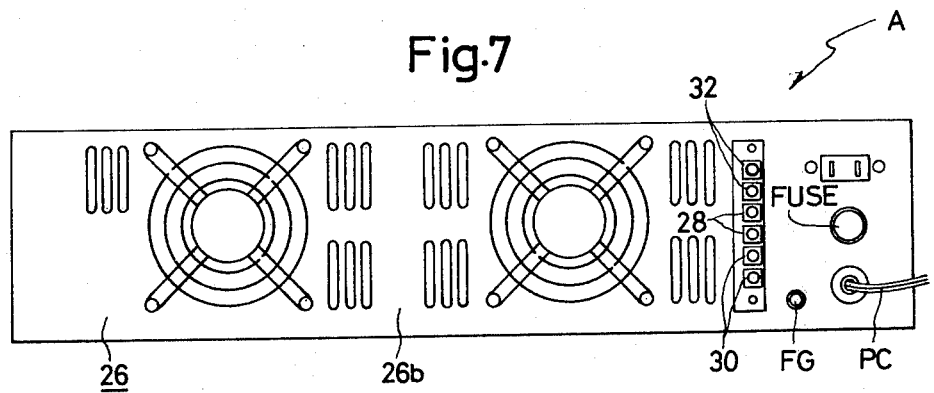
Figure 8:
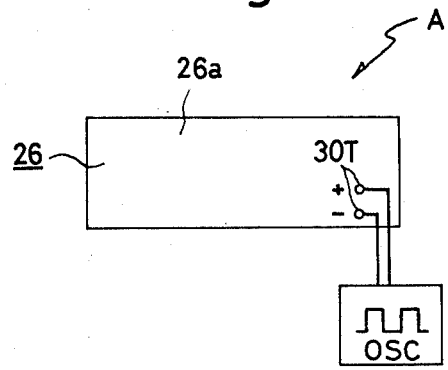
Figure 9:
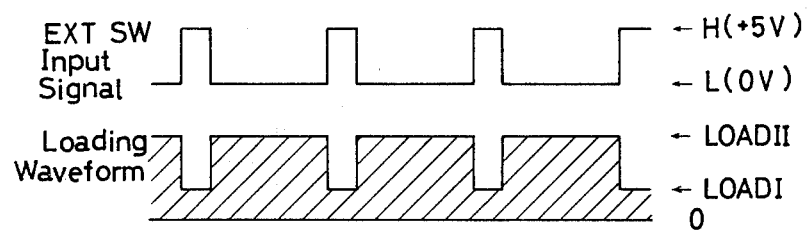
Figure 10:
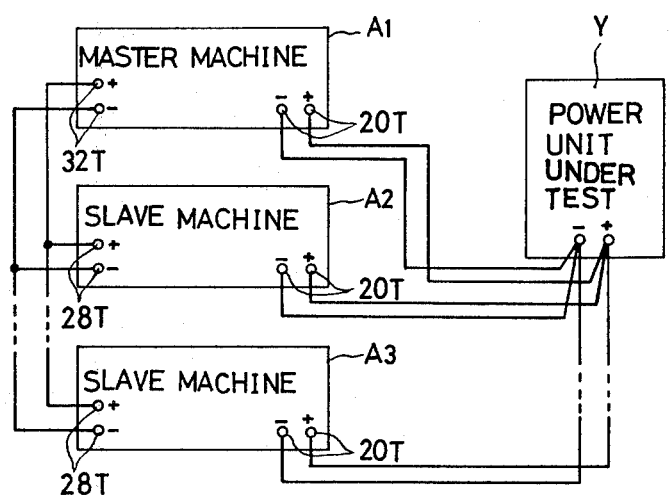

FIGS. 6 and 7 respectively illustrate a front panel which packages various push-button switches and control knobs, and a rear panel which packages various terminals, both of a case in the loading apparatus for testing a power supply of this invention;

FIG. 8 is a view in which an external switching signal generator is connected to external switching terminals of the loading apparatus for testing a power supply of this invention;

FIG. 9 illustrates an example of a load waveform signal which is in synchronism with an external switching input signal in FIG. 8;

FIG. 10 illustrates the state of connection in parallel operation according to a master slave function;

FIG. 11 illustrates the state of connection in operation as a constant current supply; and FIG. 12 is a block diagram as an alternating current loading apparatus and illustrates the state of connection in its operation.

Figure 1:
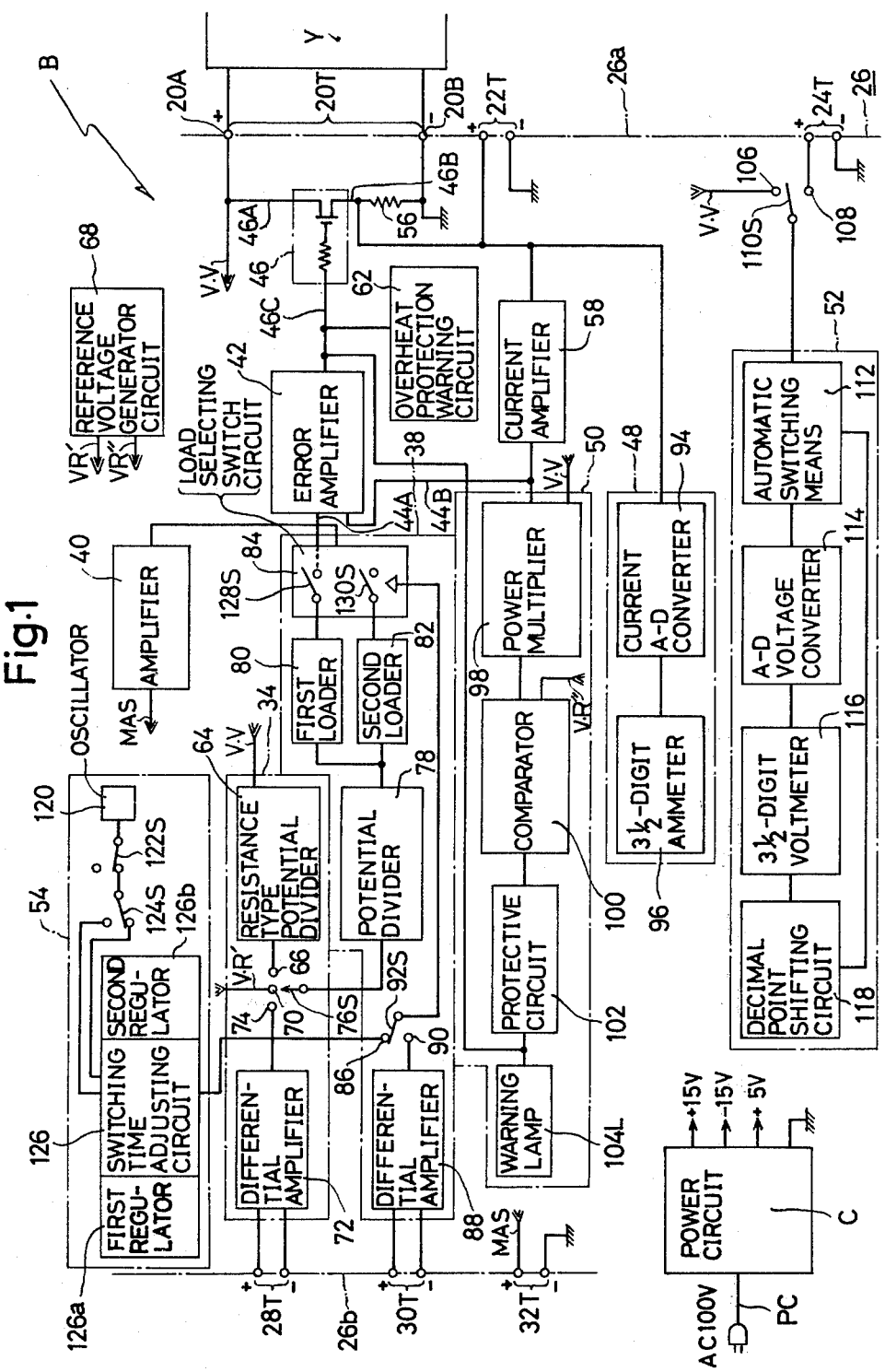
FIG. 1 is a total system diagram in the form of a block diagram of a self-contained power circuit and an electronic load circuit both incorporated in the loading apparatus for testing a power supply of this invention.

An embodiment of this invention is now described with reference to FIG. 1.

An electronic loading apparatus A according to this invention comprises an electronic load circuit B and a power circuit C for the electronic load circuit B both mounted within a case 26 which includes a front panel 26a and a rear panel 26b, the front panel 26a packaging a power input terminal 20T for a power unit under test Y, a 1 mV/A current monitoring terminal for oscilloscope 22T and an external sensing terminal 24T, the rear panel 26b packaging a slave input signal terminal 28T, an external switching input terminal 30T and a master output signal terminal 32T.

The electronic load circuit B comprises organically and systematically connected a mode switching circuit 34 capable of switching from and to one another a constant resistance mode, a constant current mode and a slave mode; a load switching circuit 38 connected to the mode switching circuit 34, each mode voltage signal past through the load switching circuit 38 being branched out also to a master output signal terminal 32T via an amplifier 40 and a simultaneous output of an error amplifier 42 serving as a control signal for a gate terminal 46C; a field effect transistor circuit 46 having a drain terminal 46A to which is input the output from the power unit Y under test via a positive power input terminal 20A and further having a source terminal 46B the output of which is fed back as a comparing voltage signal to the error amplifier 42; a current measurement display circuit 48 branched to the source terminal 46B; an overpower protection warning circuit 50; a voltage measurement display circuit 52 connected to the drain terminal 46A; and a switching time setting circuit 54 for setting an automatic switching time in the load switching circuit 38, in which between the source terminal 46B of the field effect transistor circuit 46 and a negative power input terminal 20B is connected a current detection resistor 56, further between the source terminal 46B and the error amplifier 42 and also between the source terminal 46B and the overpower protection warning circuit 50 is connected in common a current amplifier 58 having a current gain of 50, with the source terminal 46B being also connected to the current monitoring terminal for oscilloscope 22T, while on the other hand an overheat protection warning circuit 62 is connected between the error amplifier 42 and the field effect transistor circuit 46, the overheat protection warning circuit 62 having a warning lamp 60L adapted to light in an overheat condition. In the drawing, V. V is a voltage value signal coupled to the power input terminal 20T, V.R' and V.R" are reference voltage value signals generated from a reference voltage generator circuit 68, and MAS is a voltage value signal provided from the load switching circuit 38 and past through the amplifier 40.

The mode switching circuit 34 includes a constant resistance mode selecting contact 66 connected to the drain terminal 46A via a resistance type potential divider 64 adapted to drop to a desired ratio of a voltage value signal to take matching of the voltage signal value V.V, a constant current mode selecting contact 70 connected to the reference voltage generator circuit 68, a slave mode selecting contact 74 connected to a slave input signal terminal 28T via a differential amplifier 72 with an external reference voltage signal introduced, and a mode switching switch 76s for bringing the load switching circuit 38 selectively into contact with any of the contacts 66, 70 and 74.

The load switching circuit 38 is constituted by a potential divider 78 adapted to receive an input voltage value signal from the mode switching circuit 34 and to output a desired ratio of a voltage value signal, a first loader 80 and a second loader 82 both connected in parallel with the potential divider 78 and capable of individually setting continuously variable load resistance values, e.g. 0.05 Ω to 50 kΩ, or continuously variable load current values, e.g., 0.1 to 100 A, a load selecting switch circuit 84 for selecting either the first loader 80 or the second loader 82, a signal input contact 86 from the switching time setting circuit 54, an external switching signal input contact 90 connected to the external switching input terminal 30T via a differential amplifier 88, and an internal/external switching signal selection switch 92s for alternative connection with either the contact 86 or the contact 90.

The current measurement display circuit 48 is composed of a current A-D converter 94 adapted to input and digitize an analog current value signal from the source terminal 46B of the field effect transistor circuit 46, and a 3 ½-digit ammeter 96 adapted to display the digitized current value signal in the display range of 00.0 to 199.9 A.

The overpower protection warning circuit 50 comprises a power multiplier 98 adapted to input simultaneously and parallely an amplified current value signal from the current amplifier 58 and the voltage value signal V.V from the positive power input terminal 20A, a comparator 100 adapted to compare, for the protection against overpower, a power value signal from the power multiplier 98 with the reference voltage value signal V.R", a protective circuit 102 which, when there is output from the comparator 100 an excess value signal with the load power exceeding about 550 W for example in terms of an overload power display, cuts off current for a definite interval of time and thereafter, for example in about 0.3 seconds, resets automatically, and a warning lamp 104L consisting of a light emitting diode adapted to light while the protective circuit 102 is in operation.

Figure 2:
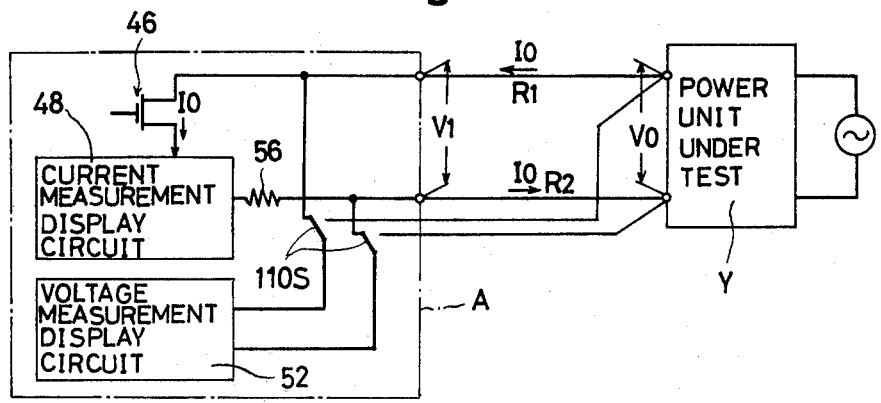
FIG. 2 illustrates how to measure voltage and current of a power unit under test by the loading apparatus for testing a power supply of this invention.

The voltage measurement display circuit 52 is constituted by an internal/external voltage value signal selecting switch 110S for alternatively switching either a voltage value signal (V.V) inputting contact 106 or a contact 108 connected to the external sensing terminal 24T, an automatic switching means 112 adapted to switch automatically into two ranges in response to an analog voltage value signal input via the internal/external voltage value signal selecting switch 110S, an A-D voltage converter 114 for converting the analog voltage value signal which has passed through the automatic switching means 112 into a digital voltage value signal, a 3 ½-digit voltmeter 116 for indicating digital voltage value signals successively in the indication range of for example 0.00 to 199.9 V, and a decimal point shifting circuit 118 for having the voltmeter 116 shift the decimal point upon receipt of a switching command signal from the automatic switching means 112. When the internal/external voltage value selecting switch 110S comes into contact with the contact 106, connection is made to the power input terminal 20T with a voltage value displayed between the power input terminals 20T of the electronic load circuit B, while when the internal/external voltage value signal selecting switch 110S comes into contact with the contact 108, connecting is made to the external sensing terminal 24T. For testing the power unit Y under test, the same unit is connected to the power source testing loading apparatus A of this invention and the load of a predetermined capacity is obtained through adjustment with the aid of the ammeter 96 and the voltmeter 116. With the contact 106 connected to the power input terminals 20T, a potential difference between the power input terminals 20T is indicated on the voltmeter 116, so when current $I_0$ in the electronic load circuit B is small the voltage value on the digital voltmeter 116 is almost equal to the voltage $V_0$ near the output terminals of the power unit under Y test because of a large voltage drop caused by resistances $R_1$ and $R_2$ of lines connecting the electronic load circuit B with the power unit under Y test, and there is established the equation $V_0=V_1+I_0R_1+I_0R_2$ (see FIG. 2).

In such a condition, the load capacity applied to the power unit under test Y becomes different from the displayed capacity, thus making it impossible to check the characteristic of the power unit Y exactly. Especially when the electronic load circuit B is cut off or made conducting in an instant, it is difficult to know exactly the characteristic of the power unit Y under test. In this case, the power unit Y under test is connected to the power input terminal 20T of the electronic load circuit B while the external sensing terminal 24T of the electronic load circuit B is connected to the power unit Y under test, and the internal/external voltage value signal selecting switch 110S is operated and the digital voltmeter 116 connected to the power unit Y under test, thereafter the power unit Y is tested.

In this case, there flows only a very small amount of current in the digital ammeter 96 and there is little voltage drop caused by the lines between the digital ammeter 96 and the power unit Y under test, so that the voltage value of the power unit Y under test itself is displayed. No matter what change may occur in the electronic load circuit B at time of testing, the full load connected to the power unit under Y test can be known exactly in terms of the current and voltage values respectively on the digital ammeter 96 and digital voltmeter 116. Besides, by observing changes on the digital voltmeter 116 it is made possible to effect other measurements for the power unit Y under test. The digital voltmeter 116 can also be used to measure the voltage of other devices.

Figure 3:
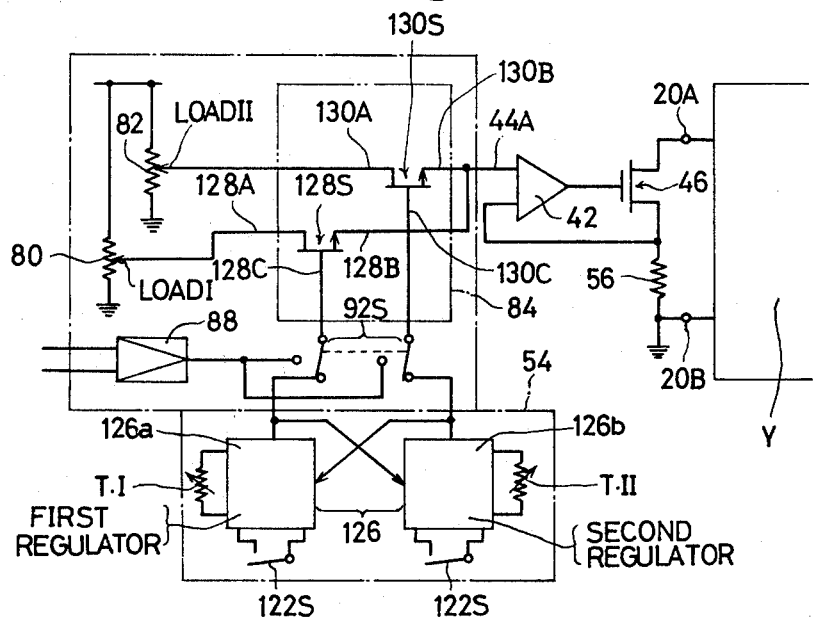
FIG. 3 illustrates the operation in an associated system diagram of a switching time setting circuit and a load switching circuit.

The switching time setting circuit 54 comprises an on-off switch 122S for making or breaking the contact with an oscillator 120, a load selecting switch 124S for selecting a switching signal from the oscillator 120 in correspondence to the first loader 80 and the second loader 82 of the load switching circuit 38, and a switching time adjusting circuit 126 in which are disposed in parallel a first regulator 126a and a second regulator 126b respectively to preset switching times $T_1$ and $T_2$ for the first and second loaders 80, 82, the switching time adjusting circuit 126 being adapted to receive a switching signal introduced through the load selecting switch 124S and to put it out to the load switching circuit 38. A concrete circuit associated with the load switching circuit 38 is as shown in FIG. 3, in which to a reference signal input terminal 44A of the error amplifier 42 are connected in parallel output terminals 128B and 130B of plural semiconductor analog switches 128S and 130S, respectively, and to input terminals 128A and 130A of the semiconductor analog switches 128S and 130S are connected the first loader 80 and the second loader 82, respectively. Furthermore, to gate terminals 128C and 130C of the semiconductor analog switches 128S and 130S are connected the first regulator 126a and the second regulator 126b, respectively, for allowing either the first loader 80 or the second loader 82 to conduct to the reference signal input terminal 44A and for setting the duration of such conduction. When the electronic loading apparatus A is not in use, the on-off switch 122S is held off whereby the gate terminals 128C and 130C of the semiconductor analog switches 128S and 130S assume a low level, allowing the first loader 80 and the second loader 82 to be cut off from the reference signal input terminal 44A, resulting in that the output voltage from the error amplifier 42 becomes zero so there no longer flows current in the field effect transistor circuit 46. On the other hand, when using the electronic loading apparatus A, the first and second loaders 80, 82 are operated in advance, for example the first loader 80 is set to a high level, while the other second loader 82 is set to a low level. And the first regulator 126a is operated to set the charging time for the set value of high level, then if the on-off switch 122S is depressed, selection command signals are output from the first and second regulators 126a, 126b, so that the semiconductor analog switches 128S and 130S conduct and the set value of the first loader 80 is applied to the reference signal input terminal 44A. In other words, if the on-off switch 122S is depressed, selection command signals are output from the first and second regulators 126a, 126b alternately at every adjusted set times $T_1$ and $T_2$, so that the semiconductor analog switches 128S and 130S are selected alternately, allowing the set values of the first and second loaders 80, 82 to be applied alternately to the reference input terminal 44A, and load currents according to the set values of the first and second loaders 80, 82 are applied alternately to the field effect transistor circuit 46 (see FIG. 4). Thus a plurality of the first and second loaders 80, 82 are connected to the reference signal input terminal 44A and the semiconductor analog switches 128S and 130S are optionally selected and switched whereby the electronic loading apparatus A assumes the same state as that undergoing load variations against the power unit Y under test, and thus a load test can be made which approximates the load variations applied to the power units of general electric devices in use.

Figure 5:
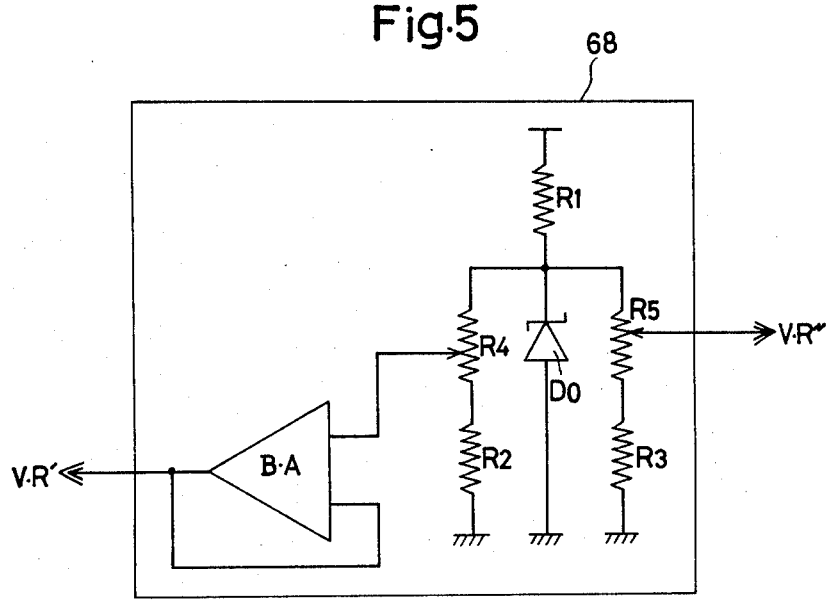
FIG. 5 is a network diagram of a reference voltage generating circuit.

The reference voltage generator circuit 68, as illustrated in FIG. 5, comprises the combination of a diode $D_0$, fixed resistors $R_1$, $R_2$, $R_3$, variable resistors $R_4$, $R_5$, and a buffer amplifier B.A, in which the reference voltage value signal V.R' which has been output is fed to the reference voltage signal input contact 70, and the reference voltage value signal V.R'' is fed to the comparator 100.

The overheat protection warning circuit 62 comprises the combination of SCR circuit (not shown) and the warning lamp 60L which uses a light emitting diode. When the temperature of the power elements of the field effect transistor circuit 46 exceeds 90° C., the circuit 62 operates immediately to allow the warning lamp 60L to light, and it is reset by again turning on the power switch.

The field effect transistor circuit 46 includes 32 power elements of N-channel MOS-FETs which are connected in parallel, and input to the drain terminal 46A from the power unit Y under test is through the positive power input terminal 20A and the output from the source terminal 46B is fed back as a comparison voltage signal to the comparison signal input terminal 44B of the error amplifier 42. But in case the power unit Y under test is tested in the constant current mode in connection to the reference voltage generator circuit 68 by contacting the mode changing switch 76S in the mode switching circuit 34 with the reference voltage input contact 70, the reference voltage value signal VR' output from the reference voltage generator circuit 68 is fed as a reference voltage signal to the error amplifier 42 via the load switching circuit 38. On the other hand, the current from the power unit under Y test flows to the current detection resistor 56 whereby a voltage drop arises. And this voltage is input as a comparison voltage signal to the error amplifier 42, where it is compared with the aforesaid reference voltage signal and the voltage output based on the potential difference is applied as a control signal to the gate terminal 46C. As previously noted, the reference voltage signal is held constant, so the current flow in the current detection resistor 56 is held constant independently of variations in the output of the power unit Y under test to give a constant current load. That is, if the current in the source terminal 46B increases and the comparison voltage signal tries to go up, the potential difference from the reference voltage signal becomes small, which appears in the gate control signal, allowing the current flowing from the power unit Y under test to the source terminal 46B to increase, and the current in the current detection resistor 56 is held constant. In this case, since the field effect transistor circuit 46 is used, there is no leakage current from the gate terminal 46C to the source terminal 46B, and the current flowing in the source terminal 46B is only the current from the power unit Y under test, for which reason, to set a load current, the voltage across the current detection resistor 56 may merely be fed back to the error amplifier 42. Consequently, the circuit configuration is simple and an exact setting can be made. Furthermore, by outputting various square load waveform signals from the load switching circuit 38, it is made possible to check exactly static and dynamic characteristics of power supply. For example, it is possible to output a reference voltage signal in the form of a pulse type square load waveform signal from the load switching circuit 38 and to check the characteristic of power supply at that time. Furthermore, if the mode changing switch 76S in the mode switching circuit 38 is connected to the power unit Y under test, the output from the latter becomes the reference voltage of the error amplifier, so this state approximates to the actual load state and thus the characteristic in this state can also be checked.

Now the switches and control knobs packaged on the front panel 26a are here explained in connection with the electronic load circuit B and with reference to FIG. 6.

The reference mark PW is a power push-button switch for turning on and off the power circuit C, and PWL is a power lamp consisting of a light emitting diode adapted to go on when the power push-button switch PW is turned on. The mode changing switch 76S can select one of three modes, the reference mark RES is a constant resistance mode push-button switch for closing the constant resistance mode selecting contact 66 and the depression thereof affords a constant resistance load, the mark CC is a constant current mode push-button switch for closing the constant current mode selecting contact 70 and the depression thereof affords a constant current load, and the mark SLAV is a slave mode push-button switch for closing the slave mode selecting contact 74 and with an external signal it can control the load current. In the internal/external switching signal selecting switch 92S, the on-off switch 122S is a starting push-button switch for switching two set values of the first and second loaders 80, 82 simultaneously with the closing of the signal input contact 86, and by turning it on there is made switching by the oscillator 120 incorporated in the power supply testing loading apparatus A of this invention, with the switching time being linked to the setting of a first time adjusting knob T.I corresponding to the first regulator 126a and a second time adjusting knob T.II corresponding to the second regulator 126b, the first and second time adjusting knobs T.I, T.II capable of being time-set each independently from 0.1 to 50 ms in PUSH state and from 10 ms to 5 s in PULL state. The mark EXT is a push-button switch which is switchable with an external signal upon turning it on by closing the external switching signal input contact 90. The load selecting switch 124S is a change-over push-button switch for a first variable knob (LOAD I) corresponding to the first loader 80 or a second variable knob (LOAD II) corresponding to the second loader 82, the first and second variable knobs LOAD I, LOAD II capable of individually setting a load resistance value (in the case of the push-button switch RES) or a load current value (in the case of the push-button switch CC), and it is possible to adjust in the range of from 0.05 Ω to 50 kΩ in the case of the push-button switch RES and from 0.1 to 100 A in the case of the push-button switch CC. The mark IP, which corresponds to the resistance type potential dividers 64, 78, is a voltage switching knob capable of switching the input voltage of the power unit Y under test, for example, capable of setting in five stages, 10 V, 20 V, 40 V and 150 V. The current monitoring terminal for oscilloscope 22T is for example 1 mV/A, the mark DV is the voltmeter 116 digital display panel, DI is the ammeter 96 digital display panel, and the warning lamp 104L is an overload power display, which lights in response to operation of the protective circuit 102 when the load power exceeds about 550 W. The warning lamp 60L is an overheat display for the power elements of the field effect transistor circuit 46 and it lights in response to operation of the overheat protection circuit 62 when the temperature of the power elements exceeds about 90° C. The internal/external voltage value signal selecting switch 110S is a changeover push-button switch of the voltage measurement terminal adapted to close either the contact 106 or the contact 108; its largely projected state connects to the power input terminal 20T of the power unit Y under test, while its depressed and slightly projected state connects to the external sensing terminal 24T, which terminal permits the voltage of the connected power supply to be read on the digital voltmeter 116. The reference numeral 20T designates a power input terminal of the power unit Y under test.

Now the terminals packaged on the rear panel 26b are here explained in connection with the electronic load circuit B.

The master output signal terminal 32T is used at time of parallel operation with the present apparatus A and is output for example at 50 mV/A with the output voltage range being for example DC 0 to 5 V; the slave input terminal 28T is loaded for example at 50 mV/A with the input voltage range being for example DC 0 to 5 V and for example with an input impedance of 50 kΩ; and with respect to the external switching input terminal 30T, the first variable knob LOAD I is loaded at TTL level "H"(+5 V) and the second variable knob LOAD II is loaded at "L" (0 V), for example with a TTL input load coefficient of 2 at an input impedance of 1 kΩ; FG is a frame ground terminal, which is grounded when the apparatus in question is used where there is much noise; FUSE is a 1 A throw type glass tube fuse; and PC is a power cord.

The following description is now provided as to how the apparatus A of this invention is to be operated.

(1) Constant Resistant Mode Operation

Operates as a constant resistance. A change in the operating voltage causes a proportional change in current value.

* Operation Procedure

1. Connect the present apparatus A to the power unit Y under test.
2. Set the voltage switching knob IP to a range above the input voltage.
3. Depress the push-button switch RES.
4. Depress the load selecting switch 124S and set the resistance value with the first variable knob LOAD I. (The resistance value can be set on the basis of voltage and current values).

(2) Constant Current Mode Operation

Operates as a constant current. Even with a change in voltage, the current does not change.

* Operation Procedure

1. Connect the present apparatus A to the power unit Y under test.
2. Set the voltage switching knob IP to a range above the input voltage.
3. Depress the push-button switch CC of the mode changing switch 76S.
4. Depress the load selecting switch 124S to bring it into a slightly projected state, and set the current value with the first variable knob LOAD I.

(3) Constant Resistance/Constant Current Mode Switching Operation

1 Switching by the internal oscillator upon depression of the on-off switch 122S of the internal/external switching signal selecting switch 92S.

In both constant resistance and constant current modes, switching of load current can be made between the two levels set by the first and second variable knobs LOAD I, LOAD II with a cycle of the first and second time adjusting knobs T.I, T.II.

* Operation Procedure

1. Connect the present apparatus A to the power unit under test Y.
2. Set the voltage switching knob IP to a range above the input voltage.
3. Select either the push-button switch RES or CC of the mode changing switch 76S.
4. Set upper and lower limit values with the load selecting switch 124S, first variable knob LOAD I and second variable knob LOAD II.
5. Set switching times $T_1$ and $T_2$ with the first and second time adjusting knobs T.I, T.II which correspond to the first and second variable knobs LOAD I, LOAD II, respectively.
6. Depress the on-off switch 122S of the internal/external switching signal selection switch 92S.

Figure 4:
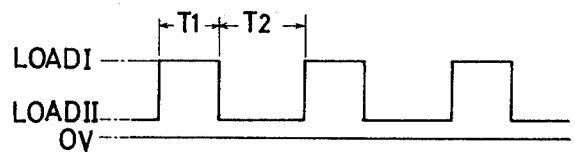
FIG. 4 illustrates an example of a load waveform signal applied to a reference signal input terminal in an error amplifier when an on-off switch is closed.

As a result, switching of such a waveform as shown in FIG. 4 is started.

2 Switching by an external signal upon depression of the push-button switch EXT of the internal/external switching dignal selection switch 92S.

In the present apparatus A, by inputting an external signal of TTL level to the external switching input terminal 30T, it becomes possible to effect other switching than the one specified herein. In this case, at a high level of the input signal there is made switching on the part of the first variable knob LOAD I, while at a low level thereof switching is on the part of the second variable knob LOAD II.

* Operation Procedure

1. Connect the present apparatus A to the power unit Y under test and further connect it to an external switching signal oscillator (OSC) as shown in FIG. 8.
2. Set the voltage switching knob IP to a range above the input voltage.
3. Select either the push-button switch RES or CC of the mode changing switch 76S.
4. Set upper and lower limit values with the internal-/external switching signal selection switch 92S, first variable knob LOAD I and second variable knob LOAD II.
5. Depress the push-button switch EXT of the internal/external switching signal selection switch 92S.

As a result, switching is started with the same cycle as the external signal as shown in FIG. 9.

(4) Parallel Operation by Master Slave Function

If it is desired to increase the load power, two or more units of the present apparatus A are provided and connected in parallel, one being as a master machine $A_1$ and the other as slave machines $A_2$, $A_3$, . . . For one master machine $A_1$ there can be connected up to five slave machines $A_2$–$A_5$.

* Operation Procedure

1. As shown in FIG. 10, connect between the present apparatus A and the power unit Y under test, and between the master output signal terminal 32T and the slave input signal terminal 28T.
2. Set either the push-button switch RES or CC of the mode changing switch 76S of the master machine $A_1$, the voltage switching knob IP and the internal-/external switching signal selection switch 92S.
3. Depress the slave mode push-button switch SLAV in the mode changing switch 76S of the slave machine.
4. Turn the first and second variable knobs LOAD I, LOAD II of the slave machine clockwise all the way.
5. Set the voltage switching knob IP to the 10 V range, the load current will flow at a ratio of 50 mV/A with respect to the voltage at the slave input signal terminal 28T.

(5) Operation as Constant Current Power Supply

If connection is made as illustrated in FIG. 11, there flows a constant preset current even with variations in the supply voltage or load R resistance value.

* Operation Procedure

1. Connect the present apparatus A, power unit $Y_0$ and load R as is illustrated in FIG. 12.
2. Set the voltage switching knob IP to a range above the voltage of the power unit $Y_0$.
3. Depress the push-button switch CC of the mode changing switch 76S.
4. Set the current value with the first variable knob LOAD I.

(6) Operation as AC Loading Apparatus

Together with a rectifier D, the present apparatus A can be used as an electronic AC loading apparatus $Y_1$.

The rectifier D comprises bridge-wise coupled diodes $D_1$, $D_2$, $D_3$ and $D_4$. The reference numerals 132A and 132B are power input terminals formed on the front panel 26a of the case 26, the terminal 132A being connected to an input node 134A of the rectifier circuit D and the terminal 132B connected to an input node 134C of the rectifier circuit D. On the other hand, an output node 134D of the rectifier circuit D is connected to the negative power input terminal 20B and an output node 134B connected to the positive power input terminal 20A.

If this apparatus $A_0$ is to be used as a loading apparatus for a DC power supply, the positive and negative potentials of the DC power unit $Y_1$ are connected to optional terminals 132A and 132B. The current from the DC power unit $Y_1$ goes through the diode $D_1$ or $D_2$ and is fed from the positive input terminal 20A to the electronic DC load circuit B, and the current from the negative terminal 132B goes through the diode $D_3$ or $D_4$ and flows to the electronic load circuit B.

Thus, for the power input terminals 132A and 132B there is no restriction concerning plus and minus, so troubles caused by erroneous connection can be prevented.

If this apparatus $A_0$ is to be used as a loading apparatus for an AC power supply, the terminals of the AC power unit $Y_1$ are connected to optional terminals 132A and 132B. The current from the AC power supply is rectified by the rectifier circuit D and is fed from the plus input terminal 20A to the electronic load circuit B and flows to the negative input terminal 20B. Also in this case, like the case of DC power supply, the input terminals are not restricted at all with respect to their connection.

* Operation Procedure

1. Connect this apparatus $A_0$ and the rectifier D as illustrated in FIG. 12, and connect AC power supply (transformer, AC converter, etc.) to the power input terminals 132A, 132B on the case 26.
2. Depress the push-button switch RES of the mode changing switch 76S.
3. Set the resistance value with the first variable knob LOAD I.

What we claim is:

1. A loading apparatus for testing a power supply under both dynamic and static conditions and wherein an artificially created dummy load simulates said power supply, comprising mode selection switching circuit means connected to select a constant resistance mode, a constant current mode and a slave mode; and load value selection switching circuit means interconnected with said mode selection switching circuit means; an error amplifier means connected to receive an input voltage signal in each said mode and a comparison voltage signal; a field effect transistor circuit means connected to receive the output of said error amplifier means as a gate control signal, said field effect transistor circuit means having a drain terminal means connected to receive the output from said power supply under test, said field effect transistor circuit means further having a source terminal means, means feeding the output of said source terminal means as said comparison voltage signal to said error amplifier means, a current display circuit means coupled to said source terminal means of said field effect transistor circuit means; an overpower protection warning circuit means also coupled to said source terminal means; a voltage display circuit means interconnected with said drain terminal means; and a loading switching time setting circuit means for setting a time period in automatic load exchange switching.

2. The loading apparatus for testing a power supply as defined in claim 1, in which said selection switching circuit means includes a constant resistance mode selecting contact means connected to said drain terminal means via a potential divider means, a constant current mode selecting contact means connected to a reference voltage generator circuit means, a slave mode selecting contact means adapted to introduce an external reference voltage and connected to a slave input signal terminal means via a differential amplifier means, and a mode changing switch means for bringing said load value selection switching circuit means selectively into contact means with any of said contacts means.

3. The loading apparatus for testing a power supply as defined in claim 1, in which said load value selection switching circuit means includes a potential divider means adapted to receive a voltage value signal from said mode selection switching circuit means and to output a voltage value signal in any desired ratio, a first and a second loader means both connected in parallel with said potential divider means and being capable of individually setting a load resistance value or load current value, a load selection switching circuit means for selecting any of said loaders, means a signal input contact from said switching time setting circuit means, an external switching signal input contact connected to an external switching input terminal means via a differential amplifier means, and an internal/external switching signal selection switch means for alternative connection of any of said contacts means to said load selection switching circuit means.

4. The loading apparatus for testing a power supply as defined in claim 1, in which said load switching circuit means and said error amplifier means are connected to a master output signal terminal means branched from therebetween and adapted to output each mode voltage signal.

5. The loading apparatus for testing a power supply as defined in claim 1, in which a current detection resistor means is interposed between the source terminal means of said field effect transistor circuit means and a minus power input terminal means.

6. The loading apparatus for testing a power supply as defined in claim 1, in which between the source terminal means of said field effect transistor circuit means and said error amplifier means and also between said source terminal means and said overpower protection warning circuit means is connected in common a current amplifier means.

7. The loading apparatus for testing a power supply as defined in claim 1, in which the source terminal means of said field effect transistor circuit means is connected to a current monitor means for oscilloscope means.

8. The loading apparatus for testing a power supply as defined in caim 1, in which as overheat protection warning circuit means is connected between said error amplifier means and said field effect transistor circuit means.

9. The loading apparatus for testing a power supply as defined in claim 1, in which said current measurement display circuit means consists of a current A-D converter means and an ammeter means.

10. The loading apparatus for testing a power supply as defined in claim 1, in which said overpower protection warning circuit means includes a power multiplier means adapted to input simultaneously in parallel a current value signal from the current amplifier means and a voltage value signal from the drain terminal means, a comparator means adapted to compare, for the protection against overpower, a power value signal from said power amplifier means with a reference voltage value signal from the reference voltage generator circuit means, a protective circuit means which, when an excess value signal is output from said comparator means, cuts off current for a definite interval of time and thereafter resets automatically, and a warning lamp means adapted to light while said protective circuit means is in operation.

11. The loading apparatus for testing a power supply as defined in claim 1, in which said voltage measurement display circuit means includes an internal/external voltage value signl selecting switch means for alternatively switching either a contact means connected to the drain terminal means or a contact means connected to the external input terminal means, an automatic switching means adapted to switch automatically into two ranges in response to an analog voltage value signal which has been input via said selection switch means, an A-D voltage converter means for converting said analog voltage value signal into a digital voltage value signal, a voltmeter means for successively indicating digitized voltage value signals, and a decimal point shifting circuit means for having said voltmeter means shifted the decimal point upon receipt of a switching command signal from said automatic switching means.

12. The loading apparatus for testing a power supply as defined in claim 1, in which said switching time setting circuit means includes an on-off switch means for making or breaking the connection with an oscillator means, a load selection switch for selecting a switching signal from said oscillator means in correspondence to said first and second loaders means of said load switching circuit means, and a switching time adjusting circuit means in which are disposed regulators means in parallel to preset switching times for said first and second loaders means, said switching time adjusting circuit means being adapted to receive a switching signal introduced via said load selection switch means and to output it to said load switching circuit means.

13. A loading apparatus for testing a power supply under dynamic and static conditions, comprising field effect transistor circuit means having gate, drain and source terminals, means coupling the power supply under test between the drain and source terminals, means deriving a comparison signal from said source terminal, an error amplifier, input signal producing means, means applying the output of said input signal producing means and said comparison signal to said error amplifier means, means coupling the output of said error amplifier means to said gate terminal, current display means coupled to said source terminal of said field effect transistor circuit means, over power protection warning circuit means coupled to said source terminal means, voltage display circuit means coupled to said drain terminal means, and a loading time setting circuit means connected to control the application of the output of said input signal producing means to said error amplifier, said input signal producing means comprising means producing a first voltage proportional to the voltage at said drain terminal, means producing a second reference voltage, means producing a third voltage proportional to an external reference signal, and selection switch means coupled to selectively apply said first, second and third voltages to said error amplifier.

* * * * *